United States Patent
Chang

(10) Patent No.: US 9,689,510 B1
(45) Date of Patent: Jun. 27, 2017

(54) CABLE ORGANIZER

(71) Applicant: Nan Juen International Co., Ltd., New Taipei (TW)

(72) Inventor: Fu-Tien Chang, New Taipei (TW)

(73) Assignee: Nan Juen International Co., Ltd., New Taipei (TW)

( * ) Notice: Subject to any disclaimer, the term of this patent is extended or adjusted under 35 U.S.C. 154(b) by 0 days.

(21) Appl. No.: 15/360,988

(22) Filed: Nov. 23, 2016

(51) Int. Cl.
*F16L 3/00* (2006.01)
*F16L 3/015* (2006.01)
*F16L 3/26* (2006.01)
*H05K 7/18* (2006.01)

(52) U.S. Cl.
CPC ............... *F16L 3/015* (2013.01); *F16L 3/26* (2013.01); *H05K 7/18* (2013.01)

(58) Field of Classification Search
CPC .............. F16L 3/015; F16L 3/26; H05K 7/18
USPC ......... 248/49; 211/26; 312/223.2; 361/679.1, 361/679.01
See application file for complete search history.

(56) References Cited

U.S. PATENT DOCUMENTS

| | | | | |
|---|---|---|---|---|
| 2006/0113433 A1* | 6/2006 | Chen | | H05K 7/1491 248/70 |
| 2010/0039007 A1* | 2/2010 | Fan | | H05K 7/1491 312/223.2 |
| 2011/0186532 A1* | 8/2011 | Wu | | H05K 7/18 211/26 |
| 2015/0342081 A1* | 11/2015 | Chang | | H05K 7/1491 361/679.02 |

\* cited by examiner

*Primary Examiner* — Gwendolyn Baxter

(57) ABSTRACT

A cable organizer includes a sliding rail assembly including a first sliding rail unit, a second sliding rail unit and a connection member with two opposite ends thereof respectively pivotally connected to the first sliding rail unit and the second sliding rail unit, and a cable-organizing rack including a first holder block and a second holder block respectively affixed to the first sliding rail unit and a first cable supporting frame and a second cable supporting frame respectively pivotally connected to the first holder block and the second holder block so that the first cable supporting frame and the second cable supporting frame can protrude out of the sliding rail assembly, facilitating maintenance.

7 Claims, 7 Drawing Sheets

US 9,689,510 B1

CABLE ORGANIZER

BACKGROUND OF THE INVENTION

1. Field of the Invention

The present invention relates to cable organizing technology and more particularly to a cable organizer that uses cable-organizing rack in a sliding rail assembly for supporting cables so that when a connection member to open the sliding rail assembly, a first cable supporting frame and a second cable supporting frame of the cable-organizing rack are biased to protrude out of the open side of the sliding rail assembly for the performance of a maintenance work without detaching the cable-organizing rack.

2. Description of the Related Art

Conventional servers commonly have a cable-organizing rack mounted between two sliding rails in the server housing so that the cables of the electronic apparatus being connected to the sliding rails can be arranged in the cable-organizing rack. However, this design of cable-organizing rack is still not satisfactory in function and has drawbacks as follows:

1. Since the cable-organizing rack needs to be moved with the sliding rails, it is mounted between the two sliding rails. When a maintenance work of the electronic apparatus is needed, the maintenance worker must detach the cable-organizing rack for the implementation of the maintenance work.

2. Since the cables that are arranged in the cable-organizing rack have a certain weight, the cable-organizing rack can be forced by the weight of the loaded cables to deform permanently and to become unusable after a long use.

SUMMARY OF THE INVENTION

The present invention has been accomplished under the circumstances in view. It is therefore the main object of the present invention to provide a cable organizer, which uses cable-organizing rack in a sliding rail assembly for supporting cables so that when a connection member to open the sliding rail assembly, a first cable supporting frame and a second cable supporting frame of the cable-organizing rack are biased to protrude out of the open side of the sliding rail assembly for the performance of a maintenance work without detaching the cable-organizing rack.

It is another object of the present invention to provide a cable organizer, which provides a support member at the bottom side of a first cable supporting frame and a second cable supporting frame of a cable-organizing rack to give support to a cable-organizing rack, avoiding deformation of the cable-organizing rack after a long use of the cable organizer.

To achieve these and other objects of the present invention, a cable organizer comprises a sliding rail assembly and a cable-organizing rack. The sliding rail assembly comprises a first sliding rail unit, a second sliding rail unit and a connection member. The first sliding rail unit comprises a first outer rail, and a first inner rail mounted in the first outer rail and movable in and out of the first outer rail. The second sliding rail unit comprises a second outer rail, and a second inner rail mounted in the second outer rail and movable in and out of the second outer rail. The connection member comprises a flat connection bar. The flat connection bar has one end thereof pivotally connected to a rear end of the first outer rail, and an opposite end thereof pivotally connected to a rear end of the second outer rail. The cable-organizing rack comprises a first holder block, a second holder block, a coupling block, a first cable supporting frame and a second cable supporting frame. The first holder block and the second holder block are respectively affixed to the first outer rail and first inner rail of the first sliding rail unit. The first cable supporting frame and the second cable supporting frame each have respective one ends thereof respectively pivotally connected to the first holder block and the second holder block, and respective opposite ends thereof pivotally connected to the coupling block.

DETAILED DESCRIPTION OF THE PREFERRED EMBODIMENT

Figure 1:
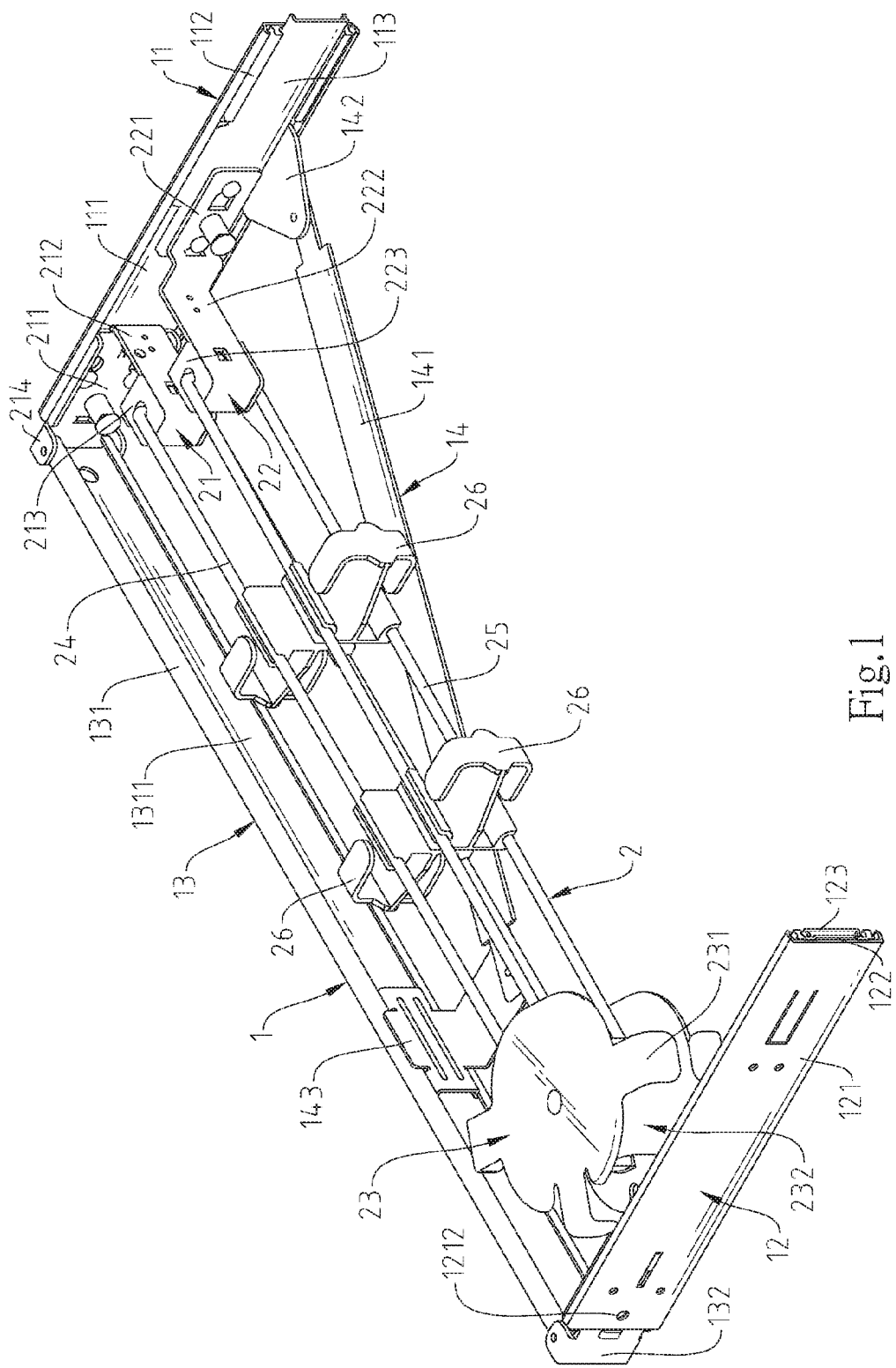
FIG. 1 is an oblique top elevational view of a cable organizer in accordance with the present invention.
Figure 2:
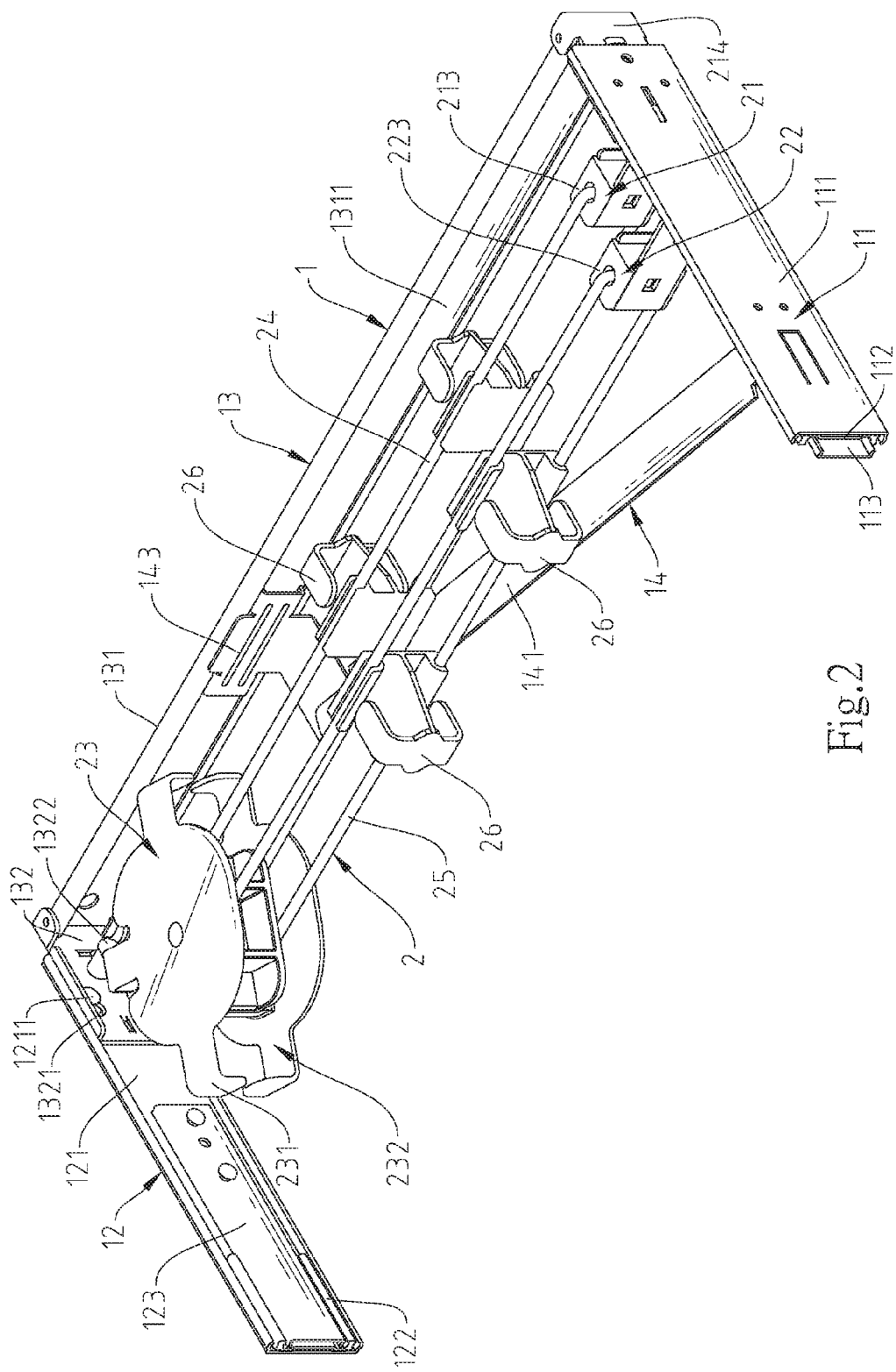
FIG. 2 corresponds to FIG. 1 when viewed from another angle.
Figure 6:
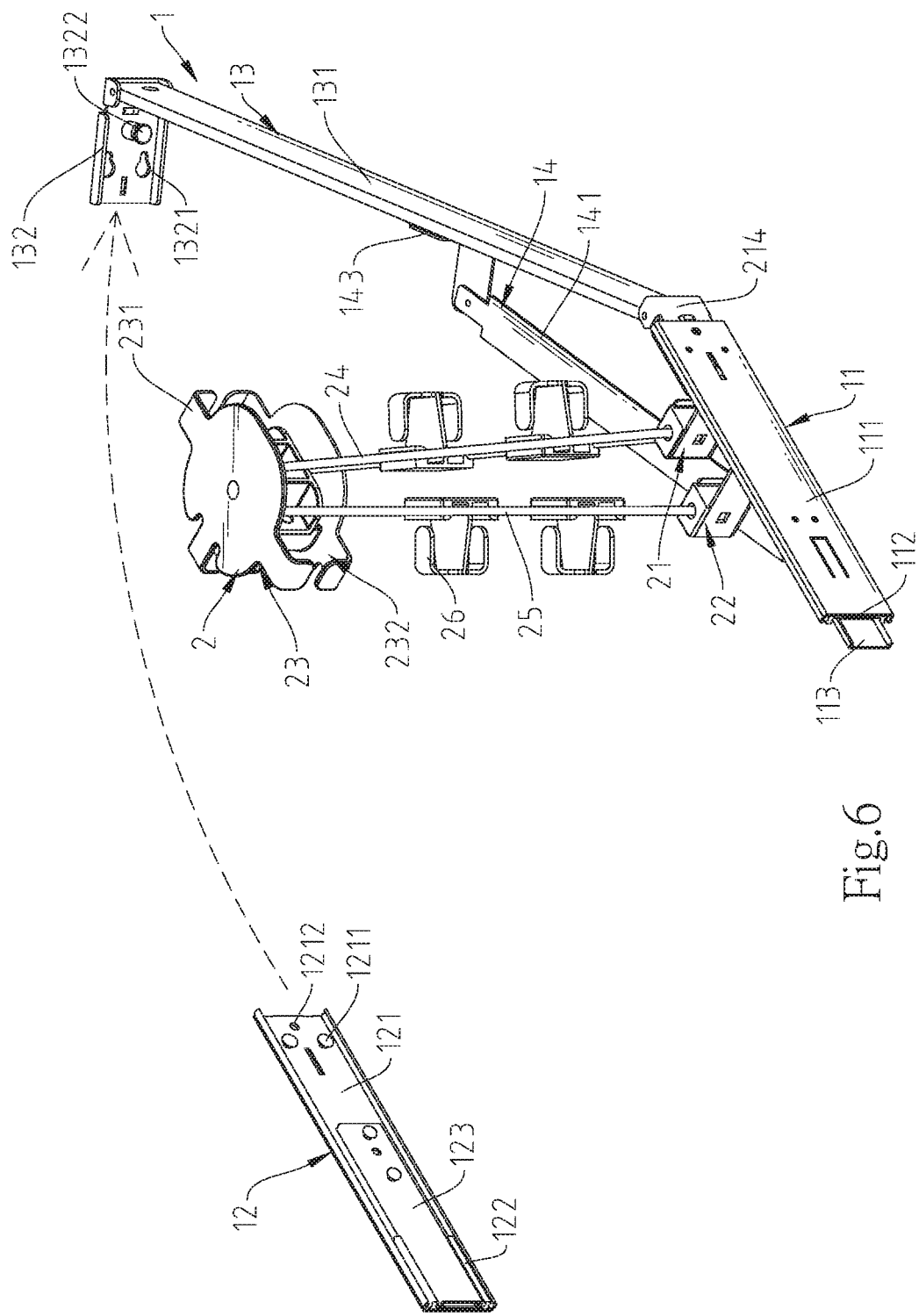
FIG. 6 is a schematic drawing of the present invention, illustrating the cable-organizing rack in a maintenance operation (II).

Referring to FIGS. 1, 2 and 6, a cable organizer in accordance with the present invention is shown. The cable organizer comprises a sliding rail assembly 1 and a cable-organizing rack 2.

The sliding rail assembly 1 comprises a first sliding rail unit 11, a second sliding rail unit 12, a connection member 13 and a support member 14. The first sliding rail unit 11 comprises a first outer rail 111, an intermediate rail 112 slidably mounted in the first outer rail 111, and a first inner rail 113 slidably mounted in the first intermediate rail 112. Further, the first intermediate rail 112 and the first inner rail 113 are respectively slidable relative to the first outer rail 111 in the same direction. The second sliding rail unit 12 comprises a second outer rail 121, a second intermediate rail 122 slidably mounted in the second outer rail 121, and a second inner rail 123 slidably mounted in the second intermediate rail 122. Further, the second intermediate rail 122 and the second inner rail 123 are respectively slidable relative to the second outer rail 121 in the same direction. The connection member 13 comprises a flat connection bar 131 pivotally connected with one end thereof to the first outer rail 111 and with an opposite end thereof to the second outer rail 121. Further, the flat connection bar 131 comprises a sliding groove 1311 located on one side and extended along the length thereof. The support member 14 comprises a flat supporting bar 141, a locating block 142 pivotally connected to one end of the flat supporting bar 141, and a displacement member 143 pivotally connected to an opposite end of the flat supporting bar 141. The locating block 142 is affixed to the first outer rail 111 of the first sliding rail unit 11. The displacement member 143 is disposed inside the sliding groove 1311 for enabling one end of flat supporting bar 141 to slide along the sliding groove 1311 of the connection member 13.

The second outer rail 121 of the sliding rail assembly 1 comprises a locating pin 1211 and a retaining hole 1212 located at one end thereof. The connection member 13 further comprises a positioning member 132 located at the flat connection bar 131 at one side of the second outer rail 121. The positioning member 132 has one end thereof pivotally connected to the flat connection bar 131. Further, the positioning member 132 comprises a locating hole 1321 and a tenon 1322. The locating hole 1321 is fastened to the locating pin 1211. The tenon 1322 is engaged into the retaining hole 1212. As illustrated, the locating hole 1321 is a gourd-shaped hole formed of a large hole and a small hole. The locating pin 1211 is inserted through the locating hole 1321 and stopped against the surface of the positioning member 132 around the small hole of the gourd-shaped locating hole 1321.

The cable-organizing rack 2 is disposed between the first sliding rail unit 11 and second sliding rail unit 12 of the sliding rail assembly 1, comprising a first holder block 21, a second holder block 22, a coupling block 23, a first cable supporting frame 24 and a second cable supporting frame 25. The first holder block 21 comprises a first mounting portion 211, a coupling lug 214 located at one side of the first mounting portion 211, a first extension portion 212 extended from an opposite side of the first mounting portion 211, and a first pivot-connection portion 213 located at the distal end of the first extension portion 212 opposite to the first mounting portion 211. Further, the first mounting portion 211 is fastened to the distal end of the first outer rail 111 of the sliding rail assembly 1. The flat connection bar 131 of the connection member 13 has one end thereof pivotally connected to the coupling lug 214 of the first holder block 21. The second holder block 22 comprises a second mounting portion 221, a second extension portion 222 extended from one side of the second mounting portion 221, a second pivot-connection portion 223 located at the distal end of the second extension portion 222 opposite to the second mounting portion 221. Further, the second mounting portion 221 is fastened to the distal end of the first inner rail 113 of the sliding rail assembly 1. The second pivot-connection portion 223 is disposed at one side of the first pivot-connection portion 213 opposite to the first outer rail 111. Further, the coupling block 23 comprises a plurality of pairs of L-shaped claws-shaped claws 231. Each pair of L-shaped claws 231 defines therein a cable-receiving space 232. The first cable supporting frame 24 and the second cable supporting frame 25 each have respective one ends thereof respectively pivotally connected to the first pivot-connection portion 213 of the first holder block 21 and the second pivot-connection portion 223 of the second holder block 22, and respective opposite ends thereof pivotally connected to the coupling block 23. Further, the first cable supporting frame 24 and the second cable supporting frame 25 are supported on the flat supporting bar 141 of the support member 14.

Further, a plurality of cable brackets 26 are arranged on the first cable supporting frame 24 and second cable supporting frame 25 of the cable-organizing rack 2 for holding cables.

Figure 3:
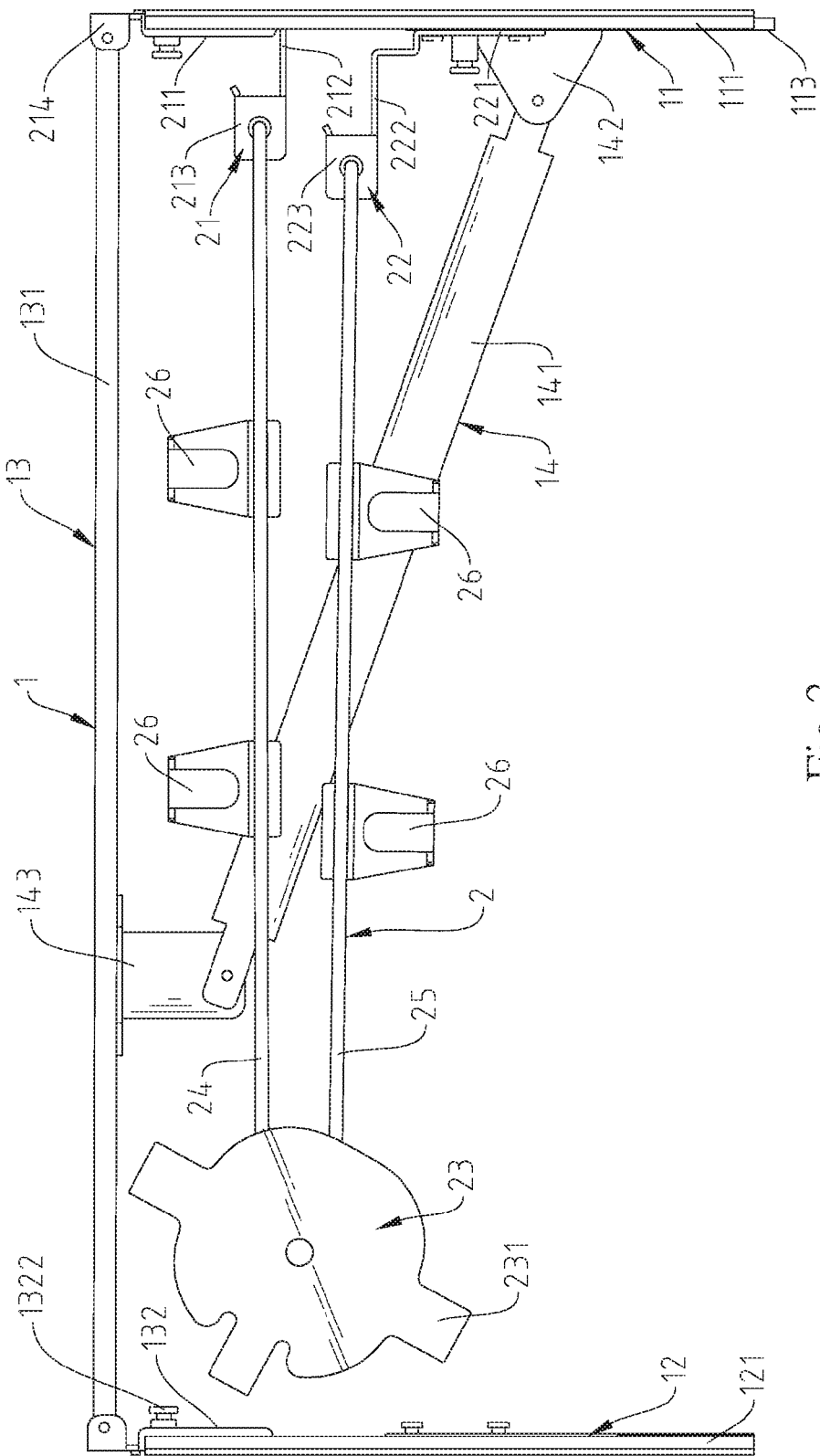
FIG. 3 is a top view of the present invention, illustrating the cable-organizing rack in the received status.
Figure 4:
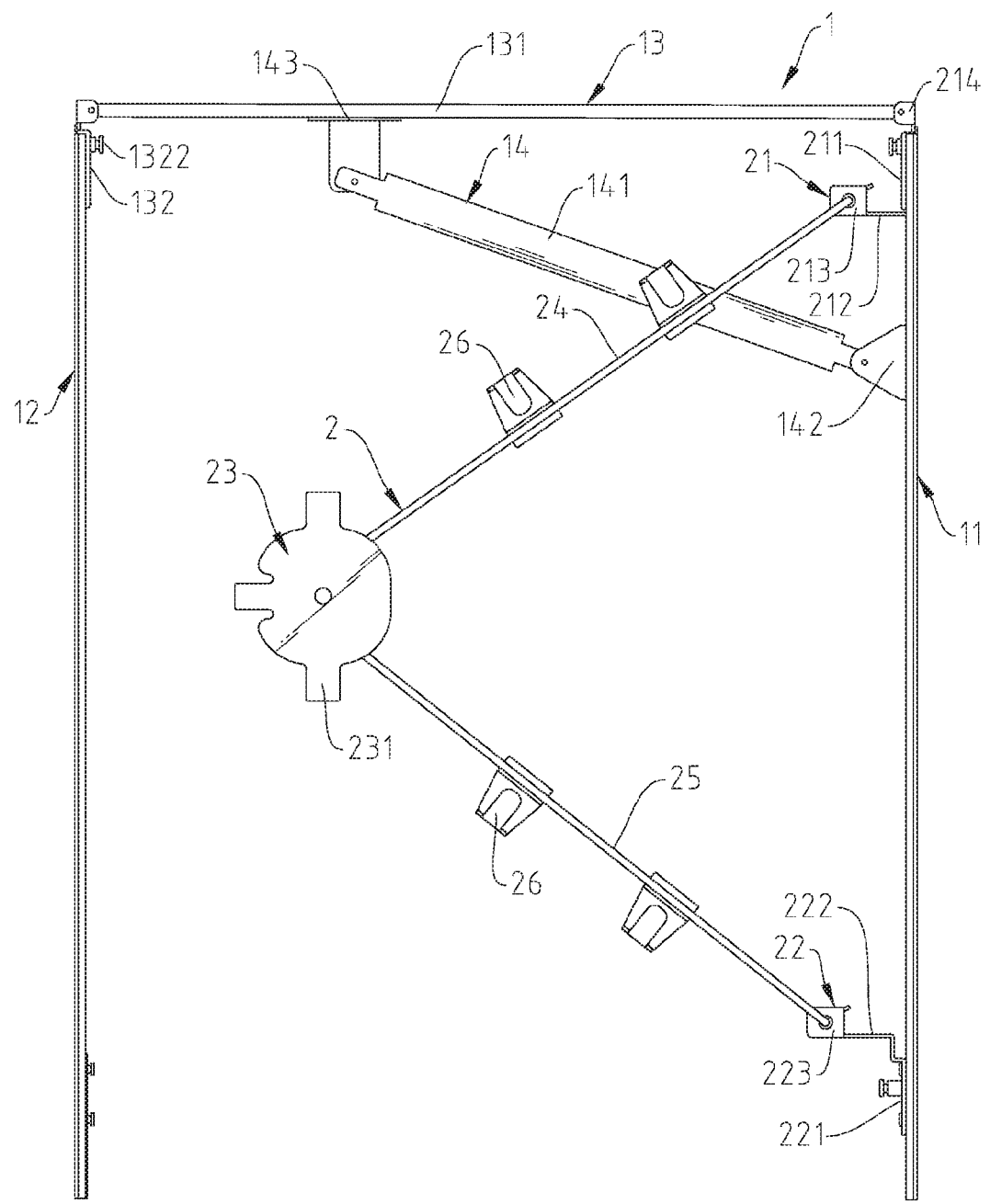
FIG. 4 is a top view of the present invention, illustrating the cable-organizing rack in the extended status.

Referring to FIGS. 2-4, in application of the cable organizer, connect the electronic apparatus (not shown) to the first inner rail 113 and second inner rail 123 of the sliding rail assembly 1, and then position the cables (not shown) of the electronic apparatus in the first cable supporting frame 24 and second cable supporting frame 25 of the cable-organizing rack 2, the cable brackets 26 and the cable-receiving spaces 232 in the coupling block 23, avoiding tangled cables. When pulling out the electronic apparatus, the second holder block 22 is moved with the first inner rail 113 in direction far from the first holder block 21, at this time, the first cable supporting frame 24 and the second cable supporting frame 25 are biased relative to the coupling block 23 and moved apart from each other. When receiving the electronic apparatus, the second holder block 22 is moved with the first inner rail 113 toward the first holder block 21, at this time, the first cable supporting frame 24 and the second cable supporting frame 25 are biased relative to the coupling block 23 and moved toward each other and, the second pivot-connection portion 223 of the second holder block 22 is disposed at one side of the first pivot-connection portion 213 of the first holder block 21 remote from the first outer rail 111, avoiding impact between the first cable supporting frame 24 and the second cable supporting frame 25 when they are moved toward each other.

Figure 5:
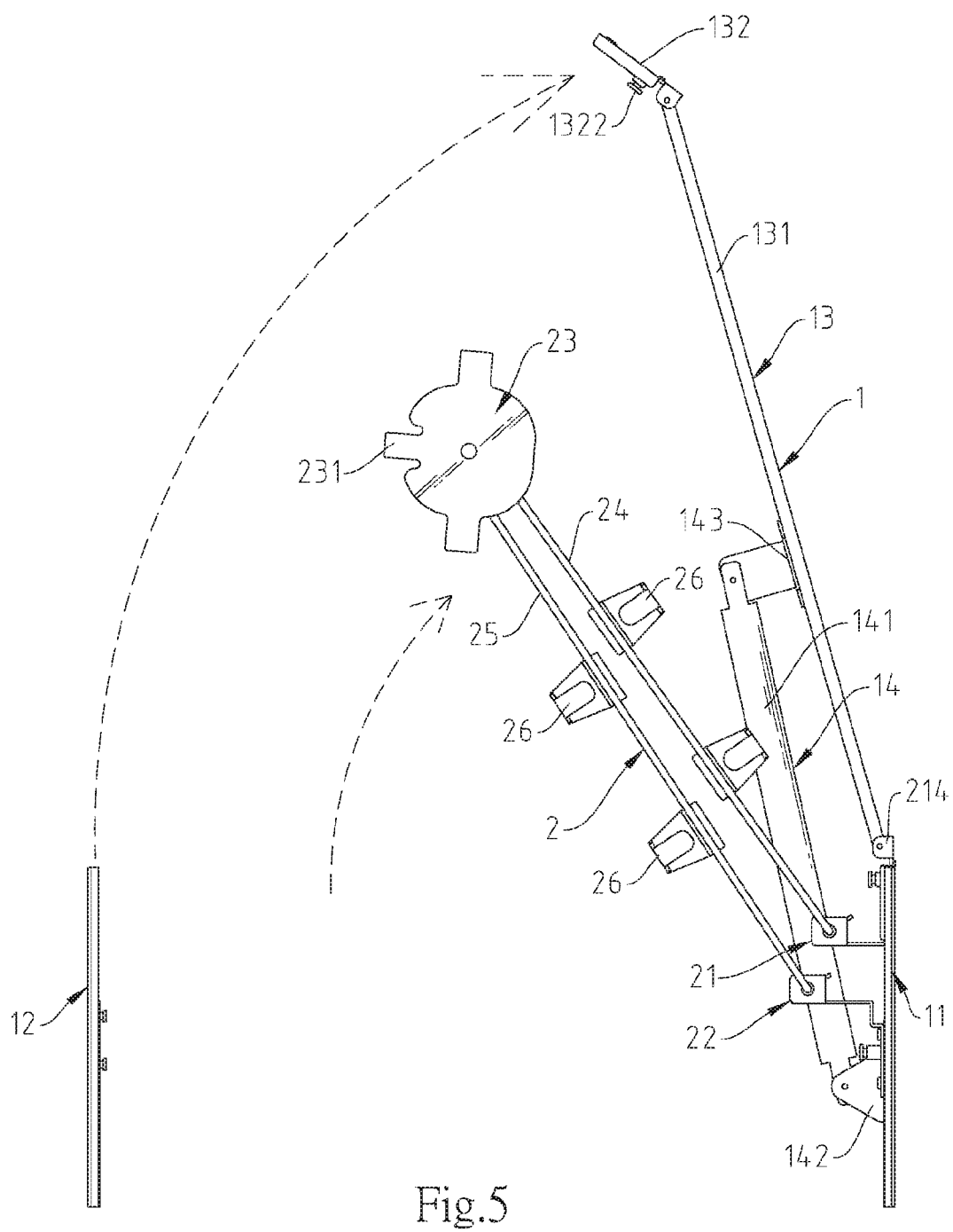
FIG. 5 is a schematic drawing of the present invention, illustrating the cable-organizing rack in a maintenance operation (I).
Figure 7:
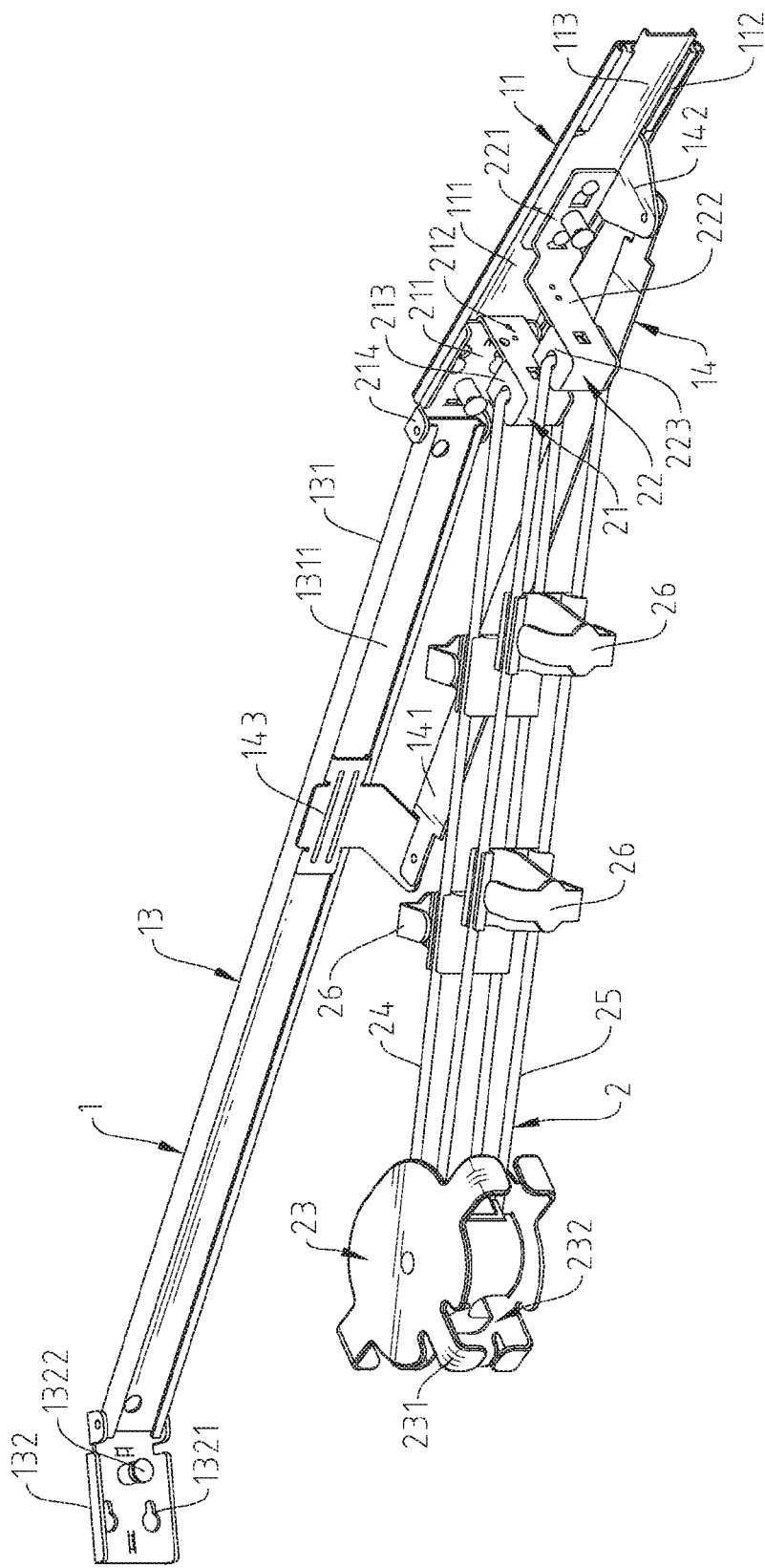
FIG. 7 is a schematic drawing of the present invention, illustrating the cable-organizing rack in a maintenance operation (III).

Referring to FIGS. 5-7, when a maintenance worker is going to maintain the electronic apparatus, push the of the positioning member 132 of the connection member 13 to move the locating pin 1211 of the second sliding rail unit 12 from the small hole of the locating hole 1321 to the large hole thereof, and then pull the positioning member 132 toward the first sliding rail unit 11 to disengage the locating pin 1211 from the locating hole 1321 so as to unlock the connection member 13 and the second sliding rail unit 12, and then bias the connection member 13 relative to the coupling lug 214 in direction away from the second sliding rail unit 12. At this time, the displacement member 143 is biased with the connection member 13 to move along the sliding groove 1311 toward the first sliding rail unit 11, thereby opening one side of the sliding rail assembly 1. At this time, bias the first cable supporting frame 24 and the second cable supporting frame 25 relative to the first holder block 21 and the second holder block 22 toward the open side of the sliding rail assembly 1, and thus, the maintenance work can maintain the electronic apparatus without detaching the cable-organizing rack 2.

What the invention claimed is:

1. A cable organizer, comprising:
   a sliding rail assembly comprising a first sliding rail unit, a second sliding rail unit and a connection member, said first sliding rail unit comprising a first outer rail and a first inner rail mounted in said first outer rail and movable in and out of said first outer rail, said second sliding rail unit comprising a second outer rail and a second inner rail mounted in said second outer rail and movable in and out of said second outer rail, said connection member comprising a flat connection bar, said flat connection bar having one end thereof pivotally connected to a rear end of said first outer rail and an opposite end thereof pivotally connected to a rear end of said second outer rail; and
   a cable-organizing rack comprising a first holder block, a second holder block, a coupling block, a first cable supporting frame and a second cable supporting frame, said first holder block and said second holder block being respectively affixed to said first outer rail and said first inner rail of said first sliding rail unit, said first cable supporting frame and said second cable supporting frame each having respective one ends thereof respectively pivotally connected to said first holder block and said second holder block and respective opposite ends thereof pivotally connected to said coupling block.

2. The cable organizer as claimed in claim 1, wherein said sliding rail assembly further comprises a support member arranged between said first sliding rail unit and said connection member, said support member comprising a flat supporting bar, said flat supporting bar having two opposite ends thereof respectively pivotally connected between two opposite ends of said first outer rail and two opposite ends of said flat connection bar; said first cable supporting frame and said second cable supporting frame of said cable-organizing rack being supported on said flat supporting bar.

3. The cable organizer as claimed in claim 1, wherein said flat connection bar of said connection member comprising a sliding groove extending along the length thereof, said support member comprises a locating block pivotally connected to one end of said flat supporting bar and a displacement member pivotally connected to an opposite end of said flat supporting bar, said locating block being affixed to said first outer rail of said first sliding rail unit, said displacement member being disposed in said sliding groove for enabling one end of said flat supporting bar to slide along said sliding groove of said connection member.

4. The cable organizer as claimed in claim 1, wherein said first holder block of said cable-organizing rack comprises a first mounting portion, and a coupling lug disposed at one side of said first mounting portion; said first mounting portion is affixed to a rear end of said first outer rail of said sliding rail assembly; said flat connection bar of said connection member has one end thereof pivotally connected to said coupling lug of said first holder block.

5. The cable organizer as claimed in claim 1, wherein said first holder block of said cable-organizing rack comprises a first mounting portion, a first extension portion extended from one side of said first mounting portion, and a first pivot-connection portion located at a distal end of said first extension portion, said first mounting portion being affixed to a rear end of said first outer rail of said sliding rail assembly; said second holder block of said cable-organizing rack comprises a second mounting portion, a second extension portion extended from one side of said second mounting portion and a second pivot-connection portion located at a distal end of said second extension portion, said second mounting portion being affixed to a rear end of said first inner rail of said sliding rail assembly, said second pivot-connection portion being located at an opposite side of said first pivot-connection portion remote from said first outer rail; said first cable supporting frame and said second cable supporting frame each have one ends thereof respectively pivotally connected to said first pivot-connection portion and said second pivot-connection portion.

6. The cable organizer as claimed in claim 1, wherein said second outer rail of said sliding rail assembly comprises a locating pin located at a rear end thereof; said connection member comprises a positioning member located at said flat connection bar at one side of said second outer rail, said positioning member having one end thereof pivotally connected to said flat connection bar, said positioning member comprising a locating hole connected to said locating pin of said second outer rail.

7. The cable organizer as claimed in claim 6, wherein said positioning member comprises a tenon; said second outer rail comprises a retaining hole located at a rear end thereof and connected with said tenon.

\* \* \* \* \*